(12) United States Patent
Forbes

(10) Patent No.: US 7,622,772 B2
(45) Date of Patent: Nov. 24, 2009

(54) ELECTRONIC APPARATUSES, SILICON-ON-INSULATOR INTEGRATED CIRCUITS, AND FABRICATION METHODS

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 171 days.

(21) Appl. No.: 11/094,614

(22) Filed: Mar. 29, 2005

(65) Prior Publication Data

US 2005/0167752 A1    Aug. 4, 2005

Related U.S. Application Data

(62) Division of application No. 10/671,229, filed on Sep. 24, 2003, now Pat. No. 7,396,779.

(51) Int. Cl.
*H01L 31/0392* (2006.01)
(52) U.S. Cl. .............. 257/347; 257/352; 257/507
(58) Field of Classification Search .......... 257/347, 257/352, 507
See application file for complete search history.

(56) References Cited

U.S. PATENT DOCUMENTS

| | | | |
|---|---|---|---|
| 4,241,359 A | 12/1980 | Izumi et al. | |
| 5,234,535 A | 8/1993 | Beyer et al. | |
| 5,441,591 A | 8/1995 | Fores et al. | |
| 5,635,429 A | 6/1997 | Grogen et al. | |
| 6,049,106 A | 4/2000 | Forbes | |
| 6,093,623 A | 7/2000 | Forbes | |
| 6,309,950 B1 | 10/2001 | Forbes | |
| 6,924,037 B1 | 8/2005 | Joret et al. | |
| 2002/0135549 A1* | 9/2002 | Kawata | 345/87 |
| 2003/0010980 A1 | 1/2003 | Yamazaki et al. | 257/65 |
| 2005/0020094 A1 | 1/2005 | Forbes et al. | |

OTHER PUBLICATIONS

C. Harendt et al. "Silicon on Insulator Material by Wafer Bonding," J. Electronic Materials, vol. 20, No. 3, pp. 267-277, Mar. 1991.

S.M. Sze, Physics of Semiconductor Devices:, John Wiley & Sons, New York (1981), pp. 850-851.

(Continued)

*Primary Examiner*—Long Pham
(74) *Attorney, Agent, or Firm*—Wells St. John P.S.

(57) ABSTRACT

An electronic apparatus includes an insulative substrate containing an aluminum-based glass and a layer containing a semiconductive material over the substrate. The insulative substrate can include aluminum oxycarbide. The insulative substrate can exhibit a CTE sufficiently close to a CTE of the semiconductive material layer such that a strain of less than 1% would exist between a 1000 Angstroms thickness of the semiconductive material layer and the insulative substrate. The semiconductive material layer can include monocrystalline silicon. The electronic apparatus can be a silicon-on-insulator integrated circuit. An electronic apparatus fabrication method includes forming an insulative substrate containing an aluminum-based glass and forming a layer containing a semiconductive material over the substrate. Forming the insulative substrate can include forming a mixture of a powder containing aluminum, a powder containing silicon, and a powder containing carbon, reacting the mixture by spontaneous ignition, and forming the reacted mixture into a plate. Forming the semiconductive material layer can include removing a layer of silicon from a monocrystalline silicon wafer and bonding the silicon layer to the insulative substrate.

21 Claims, 5 Drawing Sheets

OTHER PUBLICATIONS

J.B. Laksy, "Wafer Bonding for Silicon on Insulator Technologies," Appl. Phys. Letters, vol. 48, No. 1, pp. 78-80, Jan. 1986.

M. Breul et al., "Smart-Cut: a New Silicon on Insulator Material Technology Based on Hydrogen Implantation and Wafer Bonding," Proc. 1996 Int. Conf. On Solid State Devices and Materials, Japan. J. Appl. Phys., Part 1, vol. 36, No. 3B, pp. 1636-1641, 1996.

T. Suni et al, "Effects of Plasma Activation on Hydrophilic Bonding of Si and $SiO_2$," J. Electrochem. Soc., vol. 149, No. 6, pp. G348-G351, Jun. 2002.

U.S. Appl. No. 10/443,335, filed May 21, 2003, Forbes.

S.S.K. Iyer et al., "Separation by Plasma Implantation of Oxygen (SPIMOX) operational phase space," IEEE trans. On Plasma Science, vol. 25, No. 5, pp. 1128-1135, 1997.

G.A., Garcia et at, High Quality in Thin (100nm) Silicon on Sapphire, IEEE Trans Electron Devices vol. No. 9, No. 1, pp. 32-34, Jan. (1988).

E. Cartagena. G. Garcia, G. Imthurn, G. Kelley, H. Walker and L. Forbes, "Bonded Etchback Silicon on Sapphire Bipolar Junction Transistors," Abstracts of ECS meeting, May 1993, Honolulu, Hawaii, P. 1199.

G.P. Imthurn, G.A. Garcia, H.W. Walker, and L. Forbes, "Bonded Silicon-On-Sapphire Wafers and Devices", J. Appl. Phys., 72(6), Sep. 15, 1992, pp. 2526-2527.

P. Ball, "A Small Mountain of Materials Goes into Every Microchip," Nature Science Update, Nov. 19, 2002, http://www.nature.com/nsu/-21028/021028-12.html.

"Materials Selector", Reinhold Publishing Co., Penton/IPC. http://www.handyharmancanada.com/TheBrazingBook/comparis.htm, Sep. 2003.

Company page http://www.hithermaln.com/datasheets/index.cfm?page=values, Dec. 2002.

R. People et al, "Calculation of Critical Layer Thickness Versus Lattice Mismatch for $Ge_xSi_{1-x}$/Si Strained Layer Heterostructures,"Appl. Phys. Letters, vol. 47, pp. 322-324, Aug. 1985.

R. People et al, "Erratum: Calculation of Critical Layer Thickness Versus Lattice Mismatch for $Ge_xSi_{1-x}$/Si Strained Layer Heterostructures,"Appl. Phys. Letters, vol. 49, p. 229, Jul. 1986.

G. Grenet et al., "Testing the Feasibility of Strain Relaxed Compliant Substrates," Abstract of Electronic Materials Conference, Santa Barbara, Jun. 2002, p. 8.

K.D. Hobart et al, "High Ge-Content Relaxed $Si_{1-x}ge_x$ Layers by Relaxation on Compliant Substrate with Controlled Oxidation," Abstract of Electronic Materials Conferences, Santa Barbara, Jun. 2002, pp. 8.

P. Moran et al., "Strain Relaxation in Wafer-bonded SiGe/Si Heterostructures Due to the Viscous Flow of an Underlying Borosilicate Glass," Abstract of Electronic Materials Conference, Santa Barbara, Jun. 2002, pp. 8-9.

A.J. Auberton-Herve, "SOI: Materials to Systems," Digest of the International Electron Device Meeting, San Francisco, Dec. 1996, pp. 5-10.

T. Tsuchida et al., "Self-combustion Reaction Induced by Mechanical Activation of Al-si-c Powder Mixtures," European Journal of Solid State and Inorganic Chemistry (France), vol. 32, No. 7-8, pp. 629-638, 1995.

H.C. Yi, et al, "Combustion Synthesis of Aluminoborate Glass Matrices," J. Mater. Synth. Process. (USA), vol. 8, No. 1, pp. 15-20, Jan. 2000.

Dip. -Ing, M. Wild, Dr. -Ing, A. Gillner, "Laser Assisted Bonding of Silicon and Glass in Micro-System Technology," http://www.ilt.fhg.de/eng/jb00-s42.html, Jul. 2003.

Saman Dharmatilleke et al, "Anodic Bonding of Glass to Glass and Silicon to Glass or Silicon to Silicon Through a Very Thick Thermally Grown $SiO_2$ Layer," *Proceedings of IS 3M International Symposium on Smart Structures & Microsystems*, Hong Kong, Oct. 19-21, 2000, p. 32. http://dolphin.eng.us.edu/projects/bonding/paper.pdf.

\* cited by examiner

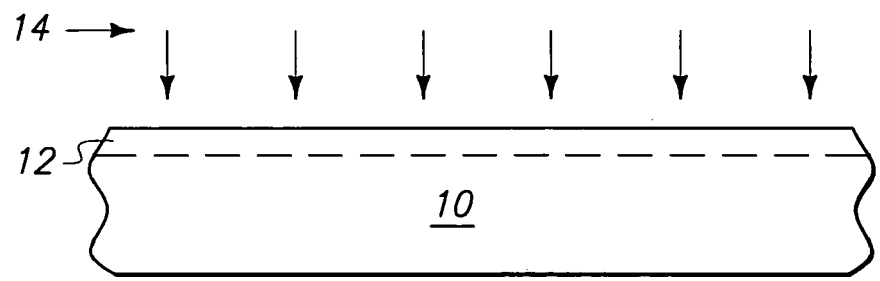
_FIG_1
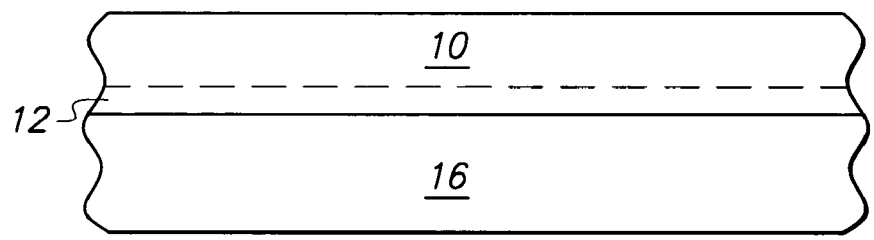
_FIG_2
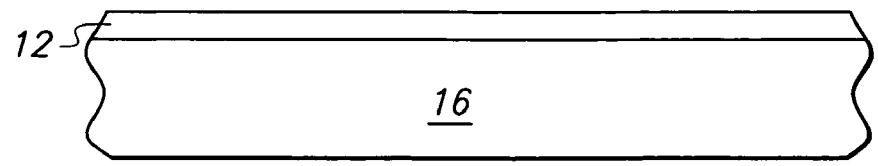
_FIG_3

ELECTRONIC APPARATUSES, SILICON-ON-INSULATOR INTEGRATED CIRCUITS, AND FABRICATION METHODS

RELATED PATENT DATA

This patent resulted from a divisional application of U.S. patent application Ser. No. 10/671,229, filed on Sep. 24, 2003 now U.S. Pat. No. 7,396,779.

This patent is related to U.S. patent application Ser. No. 10/443,335, filed on May 21, 2003, entitled "Silicon Oxycarbide Substrates for Bonded Silicon on Insulator," listing Leonard Forbes as the inventor, the entirety of which is herein incorporated by reference.

TECHNICAL FIELD

The invention pertains to electronic apparatuses, silicon-on-insulator integrated circuits, and fabrication methods for the same. The invention also pertains to memory devices including such electronic apparatuses and integrated circuits. The invention further pertains to computer systems including such memory devices.

BACKGROUND OF THE INVENTION

Almost half of the energy expended by some semiconductor-based electronic apparatuses, such as silicon microchips, during their manufacture and lifetime is spent just to produce the semiconductor material, such as silicon wafer material. Another quarter is spent during the operating lifetime of the electronic apparatuses. Any technique that reduces the energy associated with fabrication of the semiconductor material, such as a silicon wafer, and power consumption during operation may reduce the overall cost of the apparatus, such as a silicon microchip integrated circuit. Silicon-on-insulator technology can result in lower power consumption and also increase the speed of operation of integrated circuits due to a reduction in stray capacitance.

A variety of techniques may be used to implement silicon-on-insulator (SOI) technology including, but not limited to, SIMOX (Separation by IMplantation of OXygen), SPIMOX (Separation by Plasma IMplantation of OXygen), SOS (Silicon-On-Sapphire), bonding silicon wafers on oxidized silicon wafers, and forming thin film polysilicon on a glass substrate, such as for thin film transistor (TFT) technology used in liquid crystal displays. Even so, the TFT technology in display applications is often of lower performance since the silicon material is not monocrystalline and has grain boundaries.

Although the bonded wafer technology may be preferred in certain circumstances, one problem with such technology is the difference in the coefficient of thermal expansion (CTE) between the bonded materials. For example, in the case of a silicon wafer having a CTE of $2.6 \times 10^{-6}$ centimeters/(centimeters K) (cm/(cm K)) bonded to an oxidized silicon wafer having a CTE of $0.5 \times 10^{-6}$ cm/(cm K) there is a sufficient mismatch of the CTE to produce excessive stress and exceed the strain limit of the materials. If the strain is too large, then the materials will plastically deform by the introduction of dislocations, fracture and yield, or excessive wafer bowing and/or warping. Some attempts have been made to bond silicon to compliant substrates using low viscosity borophosphosilicate glass films that flow to reduce the stress. However, such attempts have not produced satisfactory results.

Accordingly, a desire exists to bond semiconductive materials to an insulative substrate without introducing excessive stress.

SUMMARY OF THE INVENTION

In one aspect of the invention, an electronic apparatus includes an insulative substrate containing an aluminum-based glass and a layer containing a semiconductive material over the substrate. By way of example, the insulative substrate can include aluminum oxycarbide. The substrate can further include aluminum carbide, silicon carbide, and α-alumina. The insulative substrate can exhibit a CTE sufficiently close to a CTE of the semiconductive material such that a strain of less than 1% would exist between a 1000 Angstrom thickness of the semiconductive material layer and the insulative substrate. The semiconductive material layer may have a thickness of about 1000 Angstroms or less. Also, the strain may be less than 0.6%. The semiconductive material layer can include monocrystalline silicon.

In another aspect of the invention, a silicon-on-insulator integrated circuit includes an insulative glass substrate containing aluminum oxycarbide, a monocrystalline silicon layer on and in contact with the substrate, and a semiconductor device that includes at least a part of the silicon layer.

In a further aspect of the invention, an electronic apparatus fabrication method includes forming an insulative substrate containing an aluminum-based glass and forming a layer containing a semiconductive material over the substrate. By way of example, forming the insulative substrate can include forming a mixture of a powder containing aluminum, a powder containing silicon, and a powder containing carbon, mechanically activating the mixture and allowing the mixture to react by spontaneous ignition, and forming the reacted mixture into a plate. Also, forming the semiconductive material layer can include removing a layer of silicon from a monocrystalline silicon wafer and bonding the silicon layer to the insulative substrate.

Also, included among aspects of the invention are memory devices having a plurality of memory cells that include at least a part of the semiconductive material layer over the insulative substrate that contains an aluminum-based glass. Such memory devices may be part of a computer system that also includes a microprocessor. The memory devices may be dynamic random access memory.

BRIEF DESCRIPTION OF THE DRAWINGS

Preferred embodiments of the invention are described below with reference to the following accompanying drawings.

FIG. 1 shows a partial, sectional view of a semiconductive material at a process step according to one aspect of the invention.

FIG. 2 shows a partial, sectional view of the semiconductive material of FIG. 1 at a subsequent process step bonded to a substrate.

FIG. 3 shows a partial, sectional view of the FIG. 2 substrate at a subsequent process step.

DETAILED DESCRIPTION OF THE PREFERRED EMBODIMENTS

Figure 5:
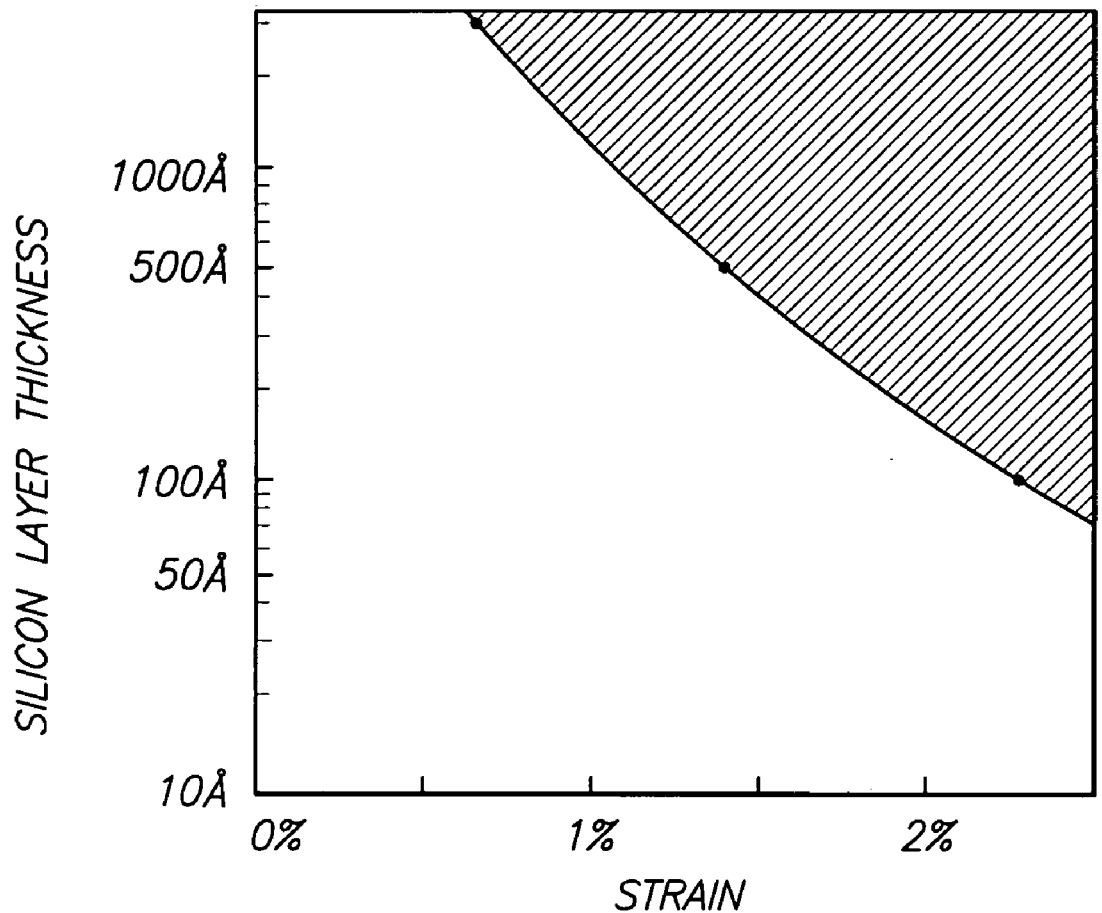
FIG. 5 is a chart demonstrating plastic deformation and elastic strain for a range of silicon layer thickness.

Aluminum-based glass is herein identified as a suitable substrate for SOI substrates. In keeping with the aspects of the invention described herein, aluminum-based glass can exhibit CTE sufficiently close to the CTE of monocrystalline silicon such that any mismatch of the CTE will not result in excessive stress nor exceed the strain limit of the materials. FIG. 5 is a chart showing yield limits for elastic strain of various silicon layer thicknesses. The hatched region of FIG. 5 represents stresses for a given thickness that were sufficient to exceed the strain limit of the silicon layer, resulting in plastic deformation and/or defects in the silicon layer.

The three data points on the curve that represents the yield limit are experimental values for 100 Angstrom, 500 Angstrom, and 3000 Angstrom thicknesses. As may be appreciated from FIG. 5, for a silicon layer having a thickness of 1000 Angstroms or less, a strain of 1% or less will not exceed the yield limit for the silicon layer. However, preferably any mismatch of CTE between a silicon layer and an aluminum-based glass substrate will be limited such that strain does not exceed 0.6%. For the aluminum-based glass compositions described herein, a strain of from about 0.2% to about 0.6% is expected.

According to one aspect of the invention, an electronic apparatus may be fabricated from a method that includes forming an insulative substrate containing an aluminum-based glass and forming a layer containing a semiconductive material over the substrate. By way of example, the method can further include forming a semiconductor device that includes at least a part of the semiconductive material layer. Also, the semiconductive material layer may be formed on and in contact with the insulative substrate. The insulative substrate may exhibit a CTE sufficiently close to a CTE of the semiconductive material layer such that a strain of less than 1% would exist between a 1000 Angstrom thickness of the semiconductive material layer and the insulative substrate. The semiconductive material layer may have a thickness of about 1000 Angstroms or less, but preferably about 1000 Angstroms. Also, the strain can be less than 0.6%.

The insulative substrate that contains an aluminum-based glass may be formed using any method known to those skilled in the art that is sufficient to produce a material compliant with the other aspects of the invention described herein. One particularly suitable method involves forming mixture of a powder containing aluminum, a powder containing silicon, and a powder containing carbon. The mixture may be mechanically activated and allowed to react by spontaneous ignition. The reacted mixture may then be formed into an aluminum-based glass plate using conventional firing techniques. The glass plate may be polished and cut into silicon wafer size shapes to act in the place of a conventional monocrystalline silicon wafer. Further chemical-mechanical polishing on the glass wafers is possible, if desired.

Exposing the mixture to air constitutes one manner in which the mixture may be allowed to react. Alternatively, allowing the mixture to react can include exposing the mixture to oxygen gas and to an inert gas excluding nitrogen. The final products within the reacted mixture exposed to air include, but are not limited to, aluminum oxycarbide, aluminum nitride, aluminum carbide, silicon carbide, and α-alumina. If the method involves exposing the mixture to oxygen gas and to an inert gas excluding nitrogen, then aluminum nitride is generally not found among the final products of the reacted mixture. Argon constitutes one example of a suitable inert gas that excludes nitrogen. The inert gas is provided along with the oxygen gas as a diluent adjusting oxygen concentration to avoid an explosive reaction.

As an example, a self-propagating high-temperature synthesis (SHS) of aluminum oxycarbide is described by Tsuchida et al., "Self-Combustion Reaction Induced by Mechanical Activation of Al—Si—C Powder Mixtures," European Journal of Solid State and Inorganic Chemistry, Vol. 32, No. 7-8, pg. 629-638, 1995. A similar SHS for aluminoborate glass may be modified in accordance with the aspects of the invention described herein to produce aluminum oxycarbide. One example of aluminoborate glass SHS is described by Yi et al., "Combustion Synthesis of Aluminoborate Glass Matrices," Journal of Materials Synthesis and Processing, Vol. 8, No. 1, pg. 15-20, 2000.

The composition of the mixture of a powder containing aluminum, a powder containing silicon, and a powder containing carbon can be adjusted to obtain a particular CTE in a plate formed from the reacted mixture to better match the CTE of the semiconductive material layer. Unfortunately, the CTE of aluminum oxycarbide is not yet well defined and is expected to be somewhat higher than the CTE of monocrystalline silicon. Regardless, the CTE of the other constituents of aluminum-based glass described herein are sufficiently close to the CTE of monocrystalline silicon such that monocrystalline silicon having a thickness of about 1000 Angstroms or less remains a suitable semiconductive material layer. A glass plate derived from SHS of Al—Si—C powder mixtures in air or argon-diluted oxygen is expected to produce a strain of about 0.2% to about 0.6% which, as shown in FIG. 5, does not exceed the yield limit of a silicon layer with a thickness of 1000 Angstroms or less. Notably, silicon carbide has a CTE of from 3.9 to $4.0 \times 10^{-6}$ cm/(cm K), aluminum oxide (alumina) has a CTE of from 7 to $8 \times 10^{-6}$ cm/(cm K), and aluminum nitride has a CTE of $4.6 \times 10^{-6}$ cm/(cm K). These may be compared to the silicon CTE of $2.6 \times 10^{-6}$ (cm/(cm K). The CTE for aluminum carbide is not available.

In the electronic apparatus fabrication method, forming the semiconductive material layer can include removing a layer of silicon from a monocrystalline silicon wafer and bonding the silicon layer to the insulative substrate. FIGS. 1-3 illustrate one example of a method of forming the semiconductive material layer. In FIG. 1, ions 14 are implanted into a semiconductive material 10 forming an implanted region 12. Monocrystalline silicon, such as found in a bulk silicon wafer, constitute one material suitable for use as semiconductive material 10. In FIG. 2, semiconductive material 10 is inverted and placed in contact with substrate 16. Substrate 16 may constitute an insulative substrate containing an aluminum-based glass. In FIG. 2, implanted region 12 of semiconductive material 10 is shown on and in contact with substrate 16. As one alternative, semiconductive material 10 shown in FIG. 1 may include an oxide layer over implanted region 12 such that the oxide layer forms an interface layer between implanted region 12 and substrate 16 of FIG. 2.

In FIG. 2, implanted region 12 is bonded to substrate 16. Subsequently, the majority of semiconductive material 10 is removed by virtue of a fracture occurring along the boundary of implanted region 12 to produce the structure shown in FIG. 3. The semiconductive material of implanted region 12 bonded to substrate 16 in FIG. 3 thus forms a SOI substrate that may be used for subsequent device fabrication. The method may further include chemically-mechanically polishing implanted region 12 bonded to substrate 16 in FIG. 3. The remaining semiconductive material 10 not bonded to substrate 16 may be subsequently chemically-mechanically polished and used again by implanting ions 14 to form another implanted region 12 that may be bonded to another substrate 16. Such process may be repeated and semiconductive material 10 gradually consumed in the process until an insufficient amount remains.

In the case where an oxide layer is formed over implanted region 12 shown in FIG. 1 to form an interface layer in the bonded structure of FIG. 2, such oxide layer may constitute a buried oxide in the structure of FIG. 3. In the event that substrate 16 is not an insulative substrate, such buried oxide isolates the semiconductive material of implanted region 12 from the non-insulative material of substrate 16. However, according to aspects of the invention herein, substrate 16 may be an insulative substrate and such buried oxide is not necessarily needed for isolation purposes. Buried oxide may nevertheless be desired for other purposes.

The implanting of ions to form implanted region 12 may include implanting hydrogen ions ($H^+$) and/or other ions that may be suitable according to the knowledge of those skilled in the art. The hydrogen ions may include deuterium ions. The bonding of implanted region 12 to substrate 16 may be accomplished by heating to at least 400° C. A temperature range of from about 400 to about 600° C. provides suitable bonding of a monocrystalline silicon layer to an aluminum-based glass substrate and the bond thus formed may be strengthened by subsequently raising the temperature to from about 800 to about 1000° C. Although minima and maxima are listed for the above described temperature ranges, it should be understood that more narrow included ranges may also be desirable. Such more narrow ranges may be particularly suitable for bonding certain material combinations.

The Smart-Cut® process used by Soitec of Benin, France is one example of a method that involves implanting ions into a wafer and bonding a silicon layer to a substrate by thermal treatment. Use and application of the Smart-Cut® process as well as other suitable bonding processes are described in U.S. Pat. No. 6,093,623, entitled "Methods for Making Silicon-On-Insulator Structures," issued to Leonard Forbes, and incorporated herein by reference for its pertinent and supported teachings. The Smart-Cut® process is also described in A. J. Auberton-Herve, "SOI: Materials to Systems," Digest of the International Electron Device Meeting, San Francisco, pg. 3-10, December 1996. Even though the Smart-Cut® process is conventionally used to bond an oxidized silicon interface layer to a silicon wafer, such method may be modified to be of use in accomplishing the aspects of the inventions described herein.

Bonding of implanted region 12 or an oxide layer formed on implanted region 12 may also be accomplished by plasma enhanced bonding such as described in Suni et al., "Effects of Plasma Activation on Hydrophilic Bonding of Si and $SiO_2$," J. Electrochem Soc., Vol. 149, No. 6, pg. G348-51, June 2002. That is, low-pressure argon or oxygen plasma may be used to activate a surface of implanted region 12 or an oxide layer over implanted region 12 to be bonded to substrate 16. Such activation promotes hydrophilic bonding and may be followed by annealing at about 400 to about 600° C. The bond may be strengthened by raising the temperature to from about 800 to about 1000° C.

Laser assisted annealing may used instead of or in addition to plasma enhanced bonding and/or thermal annealing to bond a layer of semiconductive material to an aluminum-based glass. Methods for bonding glass to silicon with lasers known to those of skill in the art may be adapted to the aspects of the invention described herein. For example, a beam from a compact Nd:YAG laser in the power range of 50 to 100 Watts may be applied to the structure shown in FIG. 2 and absorbed at the interface between implanted region 12 and substrate 16, bonding the two materials. Laser assisted annealing may be a suitable alternative to anodic bonding of oxide to glass or silicon to glass that is not appropriate for a CMOS because of a high alkali ion content of the glass.

The SOI substrates fabricated according to the aspects of the inventions described herein can be processed in a manner similar to silicon-on-sapphire wafers and semiconductor devices formed to comprise at least a part of the semiconductive material layer. In the case of ultra-thin CMOS device technology, fully depleted devices can be fabricated by masking selected device areas with oxide and nitride followed by oxidizing the unmasked silicon between the masked device mesas. Remaining device structures can be formed using conventional techniques. In the case of partially depleted CMOS device technology, with or without floating bodies, the semiconductive material layer may be patterned by a trench isolation process, such as a SIMOX process. Remaining device structures can be formed using conventional techniques. In either case, an isolated semiconductor device area is produced on an insulating substrate. Stray capacitances can be minimized because the device drain, source, and/or collectors are on an insulating glass layer. Interconnection wire may be formed over the isolation oxide and insulating substrate thereby minimizing wiring capacitance. Reducing such parasitic capacitances reduces power consumption during integrated circuit operation and increases speed of operation.

Accordingly, the use of aluminum oxycarbide glass substrates serves to reduce the energy consumption and costs compared to using high quality monocrystalline substrates where the majority of the monocrystalline substrate is not used in any semiconductor device function and serves only as a carrier substrate. Thus, the aspects of the invention avoid a waste of resources that can occur with use of high quality and high cost monocrystalline silicon substrates. Fortunately, the aspects of the invention overcome the problem of mismatch in CTE that was previously apparent in attempting to produce semiconductor-based integrated circuits on low cost glass substrates.

According to another aspect of the invention, a SOI integrated circuit fabrication method includes forming a mixture of a powder containing aluminum, a powder containing silicon, and a powder containing carbon and mechanically activating the mixture, allowing the mixture to react by spontaneous ignition. The reacted mixture is formed into a glass substrate comprising aluminum oxycarbide. The method further includes removing a layer of silicon from a monocrystalline silicon wafer, bonding the silicon wafer on and in contact with the glass substrate, and forming a semiconductor device that includes at least a part of the silicon layer.

Figure 4:
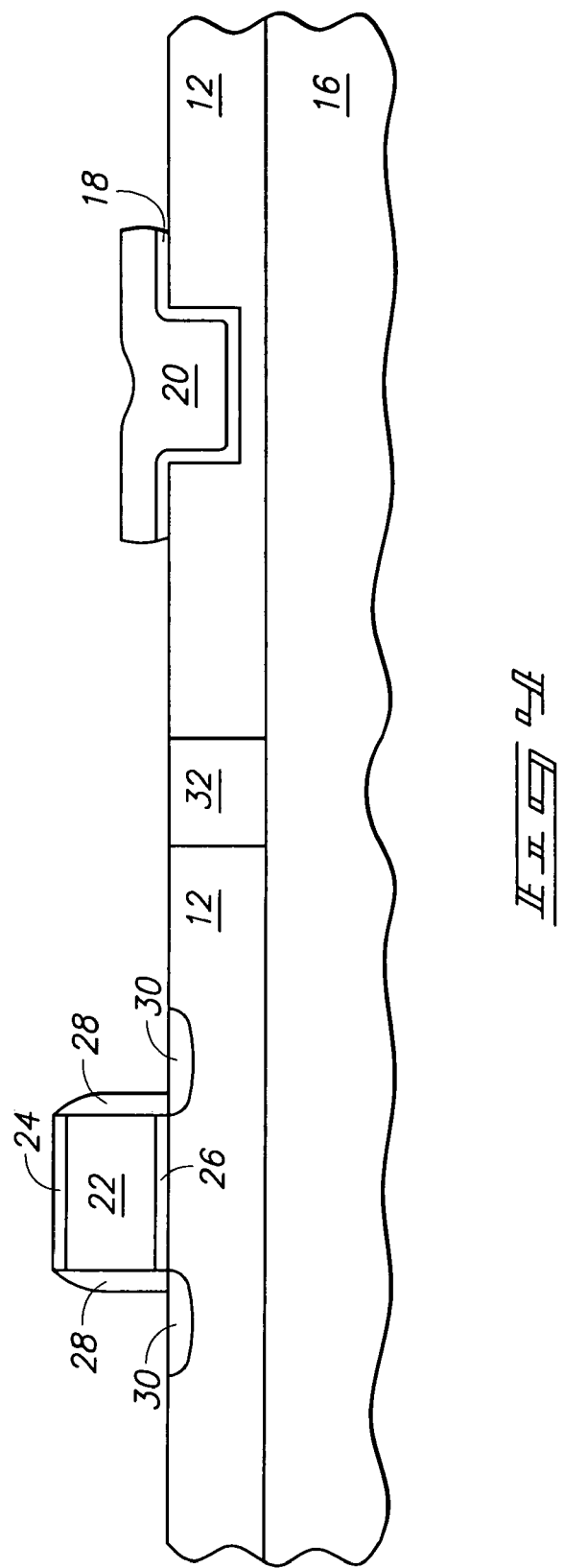
FIG. 4 shows an enlarged, partial, sectional view of the FIG. 3 substrate at a subsequent process step.

FIG. 4 shows an enlarged view of a portion of the structure of FIG. 3 and additionally shows exemplary semiconductor devices that include at least a part of a semiconductive material layer. The exemplary devices are isolated by a trench isolation region 32. In the right-half of FIG. 4, a capacitor dielectric 18 is formed within a container capacitor opening in the semiconductive material. An electrode is formed over capacitor dielectric 18. A variety of alternative capacitor structures are conceivable that also include at least a part of the semiconductive material layer. In the capacitor shown, the semiconductive material layer functions as an electrode.

In the left-half of FIG. 4, a field effect transistor is shown having a gate line 22 formed over a gate dielectric 26 on the semiconductive material layer and a cap 24 formed over the gate line. Spacers 28 are formed on the sidewalls of gate line 22 and over source/drain diffusion regions 30 in the semiconductive material. Accordingly, the transistor of FIG. 4 constitutes a device that includes at least a part of the semiconductive material layer. A variety of other transistor structures as well as other device structures are conceivable.

According a further aspect of the invention, an electronic apparatus includes an insulative substrate containing an aluminum-based glass and a layer containing a semiconductive material over the substrate. By way of example, a semiconductive device may be provided that includes at least a part of the semiconductive material layer. The semiconductive material layer can be on and in contact with the insulative substrate. The semiconductive material layer may have a thickness of about 1000 Angstroms or less. Also, the semiconductive material layer can include monocrystalline silicon. Further, the semiconductive material layer may consist of monocrystalline silicon. The insulative substrate may contain aluminum oxycarbide. Also, the insulative substrate can exhibit a CTE sufficiently close to a CTE of the semiconductive material layer such that a strain of less than 1% would exist between a 1000 Angstrom thickness of the semiconductive material layer and the insulative substrate. Preferably, the strain would be less than 0.6%.

The described property of the insulative substrate exhibiting a CTE sufficiently close to a CTE of the semiconductive material layer can be obtained even though little or no data exists regarding the CTE of certain components of the aluminum-based glass. For example, the aluminum-based glass can include aluminum carbide, silicon carbide, and α-alumina in addition to aluminum oxycarbide. The CTE for aluminum oxycarbide and aluminum carbide is not well defined. Nevertheless, the composition of the aluminum-based glass can be systematically varied in a designed experiment in keeping with the aspects of the invention. The insulative substrate can be formed, a layer containing a semiconductive material formed over the substrate, and any resulting strain subsequently measured using methods known to those skilled in the art. Using well-known principles for statistical design of experiments, the influence of composition on strain can be determined. In particular, the influence of aluminum oxycarbide and/or aluminum carbide composition on strain can be established. Thus, the absence of well-defined CTE data for some components of the aluminum-based glass does not prevent obtaining an electronic apparatus that avoids the region of excessive stress shown in FIG. 5.

According to a still further aspect of the invention, a silicon-on-insulator integrated circuit includes an insulative glass substrate containing aluminum oxycarbide, a monocrystalline silicon layer on and in contact with the substrate, and a semiconductor device that includes at least a part of the silicon layer. The benefits and advantages of such an integrated circuit are described above.

Figure 6:
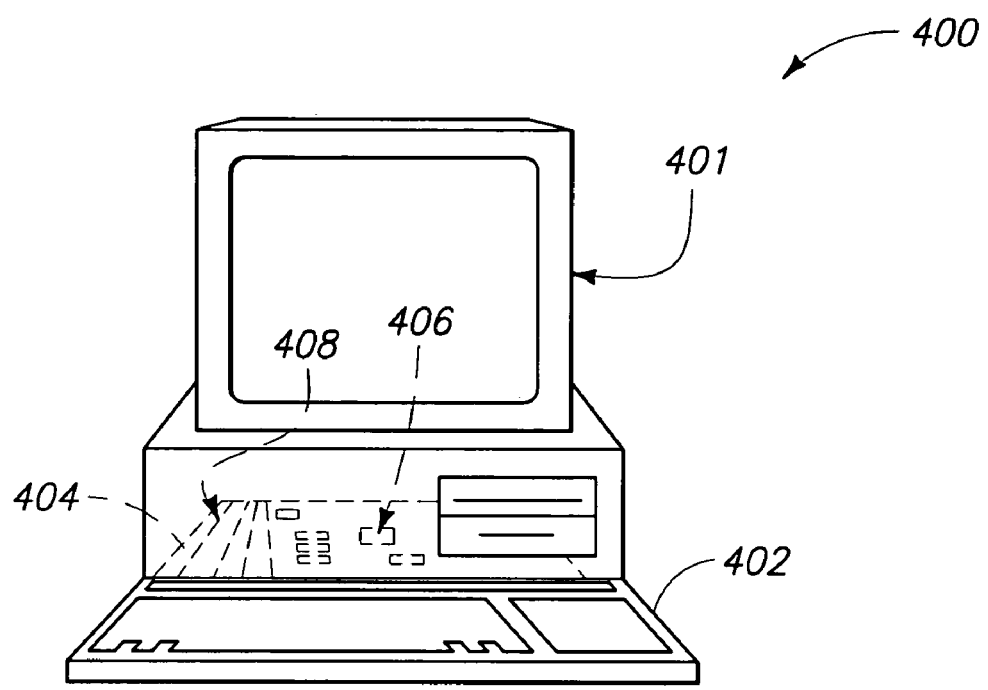
FIG. 6 shows a diagrammatic view of computer illustrating an exemplary application of the present invention.
Figure 7:
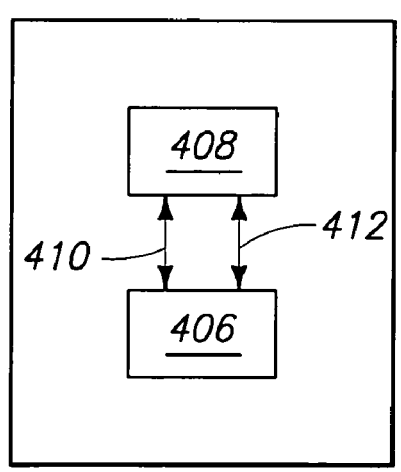
FIG. 7 is a block diagram showing particular features of the motherboard of the FIG. 6 computer.

FIG. 6 illustrates generally, by way of example, but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 7. In such block diagram, the addressing circuitry is illustrated as 410 and the read circuitry is illustrated as 412.

In particular aspects of the invention, memory device 408 can correspond to a memory module. For example, single in-line memory modules (SIMMs) and dual in-line memory modules (DIMMs) may be used in the implementation that utilizes the teachings of the present invention. The memory device can be incorporated into any of a variety of designs that provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory that allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 8:
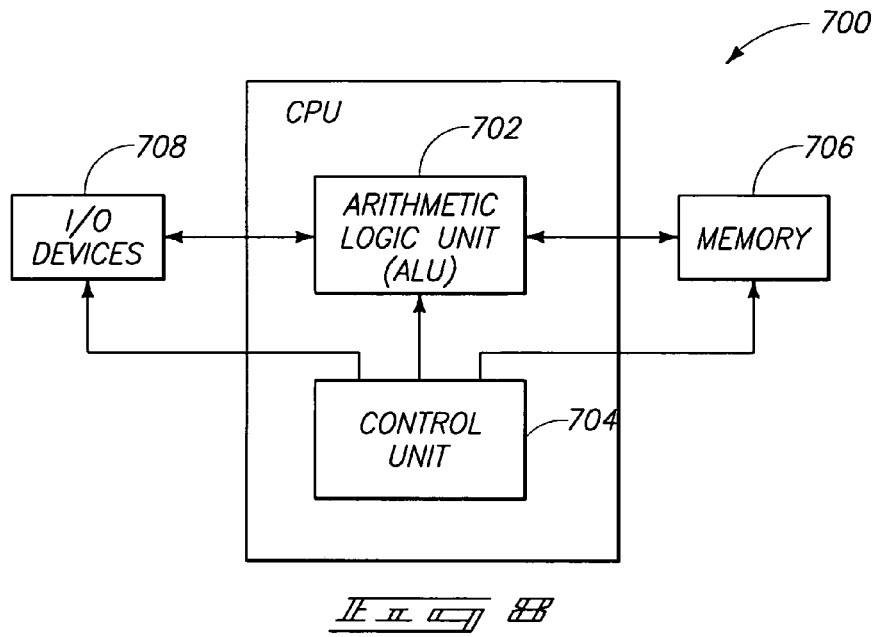
FIG. 8 shows a high level block diagram of an electronic system according to an exemplary aspect of the present invention.

FIG. 8 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various aspects of the present invention.

Figure 9:
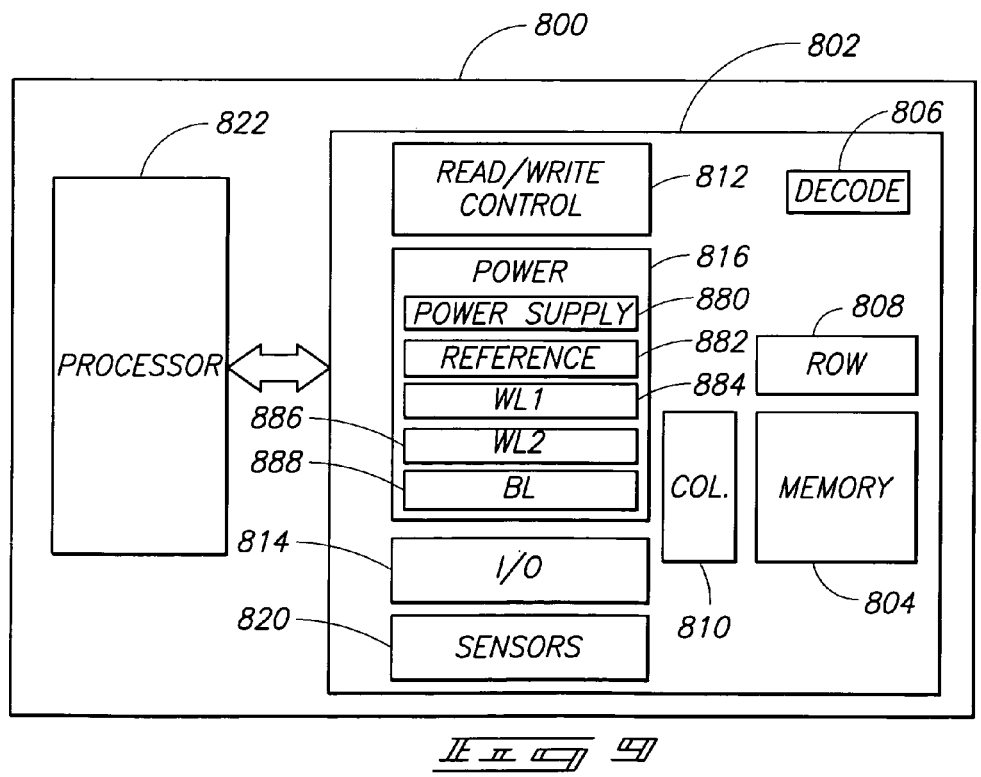
FIG. 9 shows a simplified block diagram of an exemplary device according to an aspect of the present invention.

FIG. 9 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data that is accessed via I/O lines. It will be appreciated by those skilled in the art that additional circuitry and control signals can be provided, and that the memory device 802 has been simplified to help focus on the invention. At least one of the processor 822 or memory device 802 can include a capacitor construction in a memory device of the type described previously herein.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. An electronic apparatus comprising:
   an insulative, aluminum-based glass substrate containing aluminum oxycarbide and not substantially containing aluminum nitride; and
   a layer comprising a semiconductive material over the substrate.

2. The apparatus of claim 1 further comprising a semiconductor device that includes at least a part of the semiconductive material layer.

3. The apparatus of claim 1 wherein the semiconductive material layer is on and in contact with the insulative substrate.

4. The apparatus of claim 1 wherein the semiconductive material layer comprises a portion of a monocrystalline silicon wafer bonded to the insulative substrate exhibiting a GTE sufficiently close to a CTE of the semiconductive material layer such that a strain of less than 1% would exist between a 1000 Å thickness of the semiconductive material layer and the insulative substrate.

5. The apparatus of claim 1 wherein the insulative substrate exhibits a GTE sufficiently close to a GTE of the semiconductive material layer such that a strain of less than 1% would exist between a 1000 Å thickness of the semiconductive material layer and the insulative substrate.

6. The apparatus of claim 5 wherein the semiconductive material layer has a thickness of about 1000 Å or less.

7. The apparatus of claim 5 wherein the strain would be less than 0.6%.

8. The apparatus of claim 1 wherein the semiconductive material layer comprises monocrystalline silicon.

9. A silicon-on-insulator integrated circuit comprising:
   an insulative glass substrate comprising aluminum oxycarbide;
   a monocrystalline silicon layer on and in contact with the substrate; and
   a semiconductor device comprising at least a part of the silicon layer.

10. The integrated circuit of claim 9 wherein the glass substrate further comprises aluminum carbide, silicon carbide, and alpha-alumina and does not substantially comprise aluminum nitride.

11. The integrated circuit of claim 9 wherein the glass substrate exhibits a CTE sufficiently close to a CTE of the silicon layer such that a strain of less than 1% would exist between a 1000 Å thickness of the silicon layer and the glass substrate.

12. The integrated circuit of claim 11 wherein the silicon layer has a thickness of about 1000 Å or less.

13. The integrated circuit of claim 11 wherein the strain would be less than 0.6%.

14. An electronic apparatus comprising:
   an insulative, aluminum-based glass substrate containing aluminum oxycarbide and not substantially containing aluminum nitride;
   a layer comprising a semiconductive material over the substrate; and
   a plurality of memory cells that include at least a part of the semiconductive material layer.

15. The electronic apparatus of claim 14 wherein the plurality of memory cells comprises an array of memory cells and the memory device comprises DRAM.

16. A silicon-on-insulator integrated circuit comprising:
   an insulative, aluminum-based glass substrate comprising aluminum oxycarbide;
   a monocrystalline silicon layer on and in contact with the substrate; and
   a plurality of memory cells that have a capacitor including at least a part of the silicon layer.

17. The integrated circuit of claim 16 wherein the insulative substrate does not substantially comprise aluminum nitride, the plurality of memory cells comprises an array of memory cells and the memory device comprises DRAM.

18. An electronic apparatus comprising:
   an insulative, aluminum-based substrate consisting of a glass, the glass containing aluminum oxycarbide and not substantially containing aluminum nitride; and
   a layer comprising a semiconductive material over the substrate.

19. A silicon-on-insulator integrated circuit comprising:
   an insulative substrate consisting of a glass, the glass comprising aluminum oxycarbide;
   a monocrystalline silicon layer on and in contact with the substrate; and
   a semiconductor device comprising at least a part of the silicon layer.

20. The apparatus of claim 1 wherein the glass substrate does not contain aluminum nitride.

21. The integrated circuit of claim 10 wherein the glass substrate does not comprise aluminum nitride.

* * * * *

UNITED STATES PATENT AND TRADEMARK OFFICE
CERTIFICATE OF CORRECTION

PATENT NO. : 7,622,772 B2 Page 1 of 1
APPLICATION NO. : 11/094614
DATED : November 24, 2009
INVENTOR(S) : Leonard Forbes It is certified that error appears in the above-identified patent and that said Letters Patent is hereby corrected as shown below:

Column 9, line 55, in Claim 4, delete "GTE" and insert -- CTE --, therefor.

Column 9, line 61, in Claim 5, delete "GTE" and insert -- CTE --, therefor.

Column 9, line 61, in Claim 5, delete "GTE" and insert -- CTE --, therefor.

Column 10, line 6, in Claim 9, delete "insulative" and insert -- insulative, aluminum-based --, therefor.

Signed and Sealed this

Sixteenth Day of February, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,622,772 B2 | Page 1 of 1 |
| APPLICATION NO. | : 11/094614 | |
| DATED | : November 24, 2009 | |
| INVENTOR(S) | : Forbes | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 49 days.

Signed and Sealed this

Fifth Day of October, 2010

David J. Kappos
*Director of the United States Patent and Trademark Office*

UNITED STATES PATENT AND TRADEMARK OFFICE
CERTIFICATE OF CORRECTION

PATENT NO. : 7,622,772 B2
APPLICATION NO. : 11/094614
DATED : November 24, 2009
INVENTOR(S) : Leonard Forbes It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 50 days.

Signed and Sealed this

Twenty-sixth Day of October, 2010

David J. Kappos
*Director of the United States Patent and Trademark Office*

UNITED STATES PATENT AND TRADEMARK OFFICE
CERTIFICATE OF CORRECTION

PATENT NO. : 7,622,772 B2 Page 1 of 1
APPLICATION NO. : 11/094614
DATED : November 24, 2009
INVENTOR(S) : Forbes It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 49 days.

Signed and Sealed this

Second Day of November, 2010

David J. Kappos
*Director of the United States Patent and Trademark Office*